United States Patent
Cha et al.

(10) Patent No.: US 7,782,684 B2
(45) Date of Patent: Aug. 24, 2010

(54) SEMICONDUCTOR MEMORY DEVICE OPERATING IN A TEST MODE AND METHOD FOR DRIVING THE SAME

(75) Inventors: Jae-Hoon Cha, Kyoungki-do (KR); Byoung-Jin Choi, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 235 days.

(21) Appl. No.: 11/987,829

(22) Filed: Dec. 5, 2007

(65) Prior Publication Data

US 2008/0239842 A1 Oct. 2, 2008

(30) Foreign Application Priority Data

Mar. 31, 2007 (KR) .................. 10-2007-0032053

(51) Int. Cl.
*G11C 7/00* (2006.01)
(52) U.S. Cl. .............. 365/193; 365/191; 365/233.1; 365/201; 365/194
(58) Field of Classification Search ............ 365/191, 365/193, 233.1, 201, 194
See application file for complete search history.

(56) References Cited

U.S. PATENT DOCUMENTS

| 5,204,837 | A | * | 4/1993 | Suwa et al. .................. 365/201 |
| 5,579,271 | A | * | 11/1996 | Sohn et al. .................. 365/201 |
| 6,101,147 | A | | 8/2000 | Takahashi et al. |
| 6,108,248 | A | * | 8/2000 | Oh .............................. 365/193 |
| 6,215,711 | B1 | * | 4/2001 | Kim ............................ 365/193 |
| 6,456,558 | B1 | | 9/2002 | Cho |
| 6,473,346 | B1 | * | 10/2002 | Kim et al. .................... 365/201 |
| 6,809,975 | B2 | * | 10/2004 | Yamaoka et al. ............. 365/201 |
| 6,819,623 | B2 | | 11/2004 | Jung |
| 7,130,241 | B2 | * | 10/2006 | Kim ....................... 365/189.14 |

FOREIGN PATENT DOCUMENTS

| JP | 09-045083 | 2/1997 |
| KR | 1999-016520 | 3/1999 |
| KR | 10-2000-0006526 A | 1/2000 |
| KR | 10-2007-0062866 A | 6/2007 |

OTHER PUBLICATIONS

Korean Notice of Allowance issued in Korean Patent Application No. KR 10-2007-0032053, dated Sep. 29, 2008.

* cited by examiner

*Primary Examiner*—VanThu Nguyen
*Assistant Examiner*—Eric Wendler
(74) *Attorney, Agent, or Firm*—IP & T Law Firm PLC

(57) ABSTRACT

A semiconductor memory device is capable of controlling a tRCD (RAS to CAS Delay) time regardless of an address input timing during a test operation of the semiconductor memory device. The semiconductor memory device includes a column address strobe pulse generator for generating a column address strobe pulse in response to a column command signal and a row address strobe pulse generator for receiving an active command signal or the column command signal to produce a row address strobe pulse in response to a test mode signal.

16 Claims, 6 Drawing Sheets

SEMICONDUCTOR MEMORY DEVICE OPERATING IN A TEST MODE AND METHOD FOR DRIVING THE SAME

CROSS-REFERENCE TO RELATED APPLICATIONS

This application claims priority to Korean patent application number. 10-2007-0032053, filed on Mar. 31, 2007, which is incorporated by reference in its entirety.

BACKGROUND OF THE INVENTION

The present subject matter relates to semiconductor design technologies, particularly to an address strobe pulse generation circuit for a semiconductor memory device, and more particularly to a circuit capable of adjusting tRCD (RAS to CAS Delay) to be consistent with characteristics of test equipment during a test operation of the semiconductor memory.

In general semiconductor memory devices, particularly DRAM, there is a specific specification requiring that a delay time within a given range always has to be between an RAS (Row Address Strobe) signal generated in response to an active command ACT and a CAS (Column Address Strobe) signal created in response to a read command or write command. This delay time is called tRCD, which has been used by those skilled in the art.

FIG. 1 is a block diagram showing a conventional address strobe pulse generation circuit for a semiconductor memory device.

Referring to FIG. 1, the conventional address strobe pulse generation circuit for the semiconductor memory device includes an RAS pulse generator 140 for generating an RAS pulse RAS in response to an active command signal ACT and a clock pulse CLK_P, and a CAS pulse generator 100 for generating a CAS pulse CAS in response to a column command signal RD and the clock pulse CLK_P. In addition, it further includes a clock pulse generator 180 for generating the clock pulse CLK_P having the same frequency as a clock signal CLK and a preset activation interval in response to the clock signal CLK.

More specifically, the RAS pulse generator 140 is provided with an active pulse generator 150 for latching the active command signal ACT and the clock pulse CLK_P to generate an active pulse ACT_P, and an RAS pulse output unit 160 for outputting the active pulse ACT_P as the RAS pulse RAS in response to a power-up signal PWRUP.

The CAS pulse generator 100 is provided with a column pulse generator 110 for latching the column command signal RD and the clock pulse CLK_P to produce a column pulse RD_P, and a CAS pulse output unit 120 for providing the column pulse RD_P as the CAS pulse CAS in response to the power-up signal PWRUP.

The column command signal RD set forth above is a signal which is inputted in all operations where a column address is used in DRAM. That is, the abbreviation "RD" shown in the drawing denotes a read command, and a write command WR may also be contained in the column command signal.

FIG. 2 is a detailed circuit diagram of the CAS pulse output unit of the conventional address strobe pulse generation circuit shown in FIG. 1.

Referring to FIG. 2, the CAS pulse output unit 120 included in the conventional address strobe pulse generation circuit is provided with a driver 122 for driving an output node OUT_NODE in response to a column pulse RD_P received through an input end IN, and a pulse output unit 124 for providing a pulse applied to the output node OUT_NODE as a CAS pulse CAS in response to an inverted signal PWRUPB of a power-up signal.

Here, the driver 122 is composed of a PMOS transistor P1 and an NMOS transistor N1 between a power supply voltage VDD end and a ground voltage VSS end. Among these, the PMOS transistor P1 controls the connection of the power supply voltage VDD end and the output node OUT_NODE in response to the column pulse RD_P received via a gate coupled to the input end IN, and the NMOS transistor N1 controls the connection of the output node OUT_NODE and the ground voltage VSS end in response to the column pulse RD_P accepted via a gate coupled to the input end IN.

Further, the pulse output unit 124 is composed of a first inverter INV1 for taking and inverting a pulse applied to the output node OUT_NODE, a NAND gate NAND for performing a NAND-operation on an output signal of the first inverter INV1 and an inverted signal PWRUPB of the power-up signal to provide a resulting signal to the output node OUT_NODE, a second inverter INV2 for accepting and inverting an output signal of the first inverter INV1, and a third inverter INV3 for inverting an output signal of the second inverter INV2 to output an resulting signal as the CAS pulse CAS through an output end OUT.

Although not shown, the RAS pulse output unit 160 is similar to the CAS pulse output unit 120 in configuration. One difference therebetween is that the column pulse RD_P is inputted to the input end IN and the CAS pulse CAS is outputted from the output end OUT in the CAS pulse output unit 120, while the active pulse ACT_P is inputted to the input IN end and the RAS pulse RAS is outputted from the output OUT end in the RAS pulse output unit 160.

Based on the configuration as above, the operation of the conventional address strobe pulse generation circuit for the semiconductor memory device will be described below in detail.

First, the clock pulse generator 180 serves to prevent malfunctions of the semiconductor memory device due to a variation of activation interval of the clock signal CLK caused by the effect of environments under which the semiconductor memory device operates, which will occur because the clock signal CLK inputted thereto is a signal from the outside of the semiconductor memory device.

That is to say, in response to activation of the clock signal CLK being inputted, the clock pulse generator 180 provides the clock pulse CLK_P which is deactivated after it is activated for a given time period.

The CAS pulse generator 100 generates the CAS pulse CAS in response to the column command signal RD, wherein the CAS pulse CAS is controlled to have the same activation interval as the clock pulse CLK_P.

Further, the CAS pulse generator 100 is configured such that the operation thereof is controlled in response to the power-up signal PWRUP. This is to prevent the generation of a wrong CAS pulse CAS before the power-up signal PWRUP is activated.

The RAS pulse generator 140 generates the RAS pulse RAS in response to the active command signal ACT. At this time, the RAS pulse RAS is controlled to have the same activation interval as the clock pulse CLK_P.

Also, the RAS pulse generator 140 is configured such that the operation thereof is controlled in response to the power-up signal PWRUP. This is to prevent the generation of wrong RAS pulse RAS before the power-up signal PWRUP is activated.

The conventional address strobe pulse generation circuit for the semiconductor memory device having the configuration and operation set forth above employs a method which makes the time points of inputting the active command signal ACT and the column command signal RD different from each other in order to meet the specification of tRCD.

Thus, the following operational timing diagrams can be shown, on the basis of the conventional address strobe pulse generation circuit for the semiconductor memory device.

FIG. 3A is a signal timing diagram showing an operation of the conventional address strobe pulse generation circuit depicted in FIG. 1.

Referring to FIG. 3A, the conventional address strobe pulse generation circuit for the semiconductor memory device operates in the sequence as follows.

First of all, the clock pulse CLK_P is outputted in response to the clock signal CLK (①). Next, the active command signal ACT is inputted in response to the active command Active (②). The active command signal ACT and the clock pulse CLK_P are latched to generate the active pulse ACT_P (③). Thereafter, the RAS pulse RAS is outputted in response to the active pulse ACT_P.

After inputting the active command signal ACT in response to the active command Active, the column command signal RD is inputted in response to the read command Read after a preset tRCD delay time, which corresponds to one period of the clock signal CLK in the drawing, regardless of the output process of the RAS pulse RAS (⑤).

The column command signal RD and the clock pulse CLK_P are latched to output a column pulse RD_P (⑥). Next, the CAS pulse CAS is provided in response to the column pulse RD_P.

As shown in FIG. 3A, in the conventional address strobe pulse generation circuit for the semiconductor memory device, the time taken between the active command signal ACT and the column command signal RD being inputted was just tRCD of DRAM.

Meanwhile, as the capacity of the DRAM increases, the development of DRAM that applies an address double pump that is a technique of effectively addressing a plurality of memory cells therein has been started.

Briefly explaining the address double pump, the number of address pins should be increased in proportion to the increase in the capacity of DRAM. At this time, only preset address pins are shared and used, rather than indefinitely increasing the number of address pins.

For example, if the number of address pins required in DRAM is 12 (A0 to A11), only preset 6 pins (A0 to A5) are used, rather than all of 12 pins, wherein 6 bits address are received twice in order to receive the entire address of 12 bits.

By the way, the DRAM using such an address double pump gives rise to a phenomenon in which the minimum delay value of tRCD is limited, as set forth below.

FIG. 3B is a signal timing diagram showing an operation of the conventional address strobe pulse generation circuit applied to a semiconductor memory device using the address double pump.

Referring to FIG. 3B, it can be seen that timing variations (①~⑦) of signals and pulses ACT, ACT_P, RD, RD_P, RAS, and CAS, used when the conventional address strobe pulse generation circuit depicted in FIG. 1 is applied to a semiconductor memory device using the address double pump, are completely identical to those used in the conventional address strobe pulse generation circuit of FIG. 3A.

However, the read command signal RD cannot be inputted at next clock just after input of the active command signal ACT in FIG. 3B, whereas the read command signal RD is inputted at a next clock just after input of the active command signal ACT in FIG. 3A.

This is because the row address inputted in response to the active command signal ACT is not ended until the next clock after input of the active command signal ACT due to the operation of the address double pump.

Thus, there is a phenomenon in which the minimum delay time of tRCD corresponds to two clocks in the case of DRAM that uses the address double pump, while the minimum delay time of tRCD corresponds to one clock in DRAM that does not use the address double pump.

In case where the DRAM that uses the address double pump operates in normal mode, although the minimum value of tRCD is limited, this may lead to a variation in the specification of DRAM only, but becomes no factor causing malfunctions.

However, in actually manufacturing DRAM through a series of processes, DRAM manufactured in wafer level has to be tested to know whether it meets the tRCD value required in the preset specification.

In addition, in order to keep the probability such that the DRAM that has passed such test malfunctions during an actual operation minimized, the test is generally conducted by applying severer environments or conditions than those in the place where DRAM is actually used.

This test method is also applied to testing tRCD of DRAM. Assuming that the specification of tRCD delay time of DRAM is 15 ns, the test is done under the criterion of tRCD delay time of about 10 to 12 ns less than the value given in the specification. In this case, if DRAM has a higher tRCD delay time than the above criterion, it is decided to be fail.

Thus, when testing DRAM to check whether it has a tRCD value meeting the preset specification during the process of manufacturing DRAM using the address double pump, if the DRAM is under the state that it is already set to the minimum tRCD delay time, the normal test cannot be conducted as not being done within any time less than the minimum tRCD delay time.

Due to this, the design change needs to be made in order to carry out the test, thereby requiring a prolonged time period in developing DRAM using the address double pump.

SUMMARY OF THE INVENTION

Embodiments of the present invention are directed to providing a semiconductor memory device capable of controlling a tRCD (RAS to CAS Delay) time regardless of an address input timing during a test operation of the semiconductor memory device.

In one embodiment, a semiconductor memory device includes a column address strobe pulse generator for generating a column address strobe pulse in response to a column command signal and a row address strobe pulse generator for receiving an active command signal or the column command signal to produce a row address strobe pulse in response to a test mode signal.

In another embodiment, a method for driving a semiconductor memory device includes generating a column address strobe pulse in response to a column command signal and receiving an active command signal or the column command signal to produce a row address strobe pulse in response to a test mode signal.

DESCRIPTION OF SPECIFIC EMBODIMENTS

Hereinafter, preferred embodiments of the present invention will be described in detail with reference to the accompanying drawings. The present invention is not limited to the embodiments disclosed below, but may be implemented in various forms. The embodiments set forth below are provided only for complete disclosure of the invention and so that those skilled in the art can fully know the scope of the invention.

For reference, it is assumed that a semiconductor memory device in accordance with exemplary embodiments of the invention employs an address double pump. Particularly, the semiconductor memory device of the invention is assumed to be DRAM adopting GDDR4.

Figure 4:
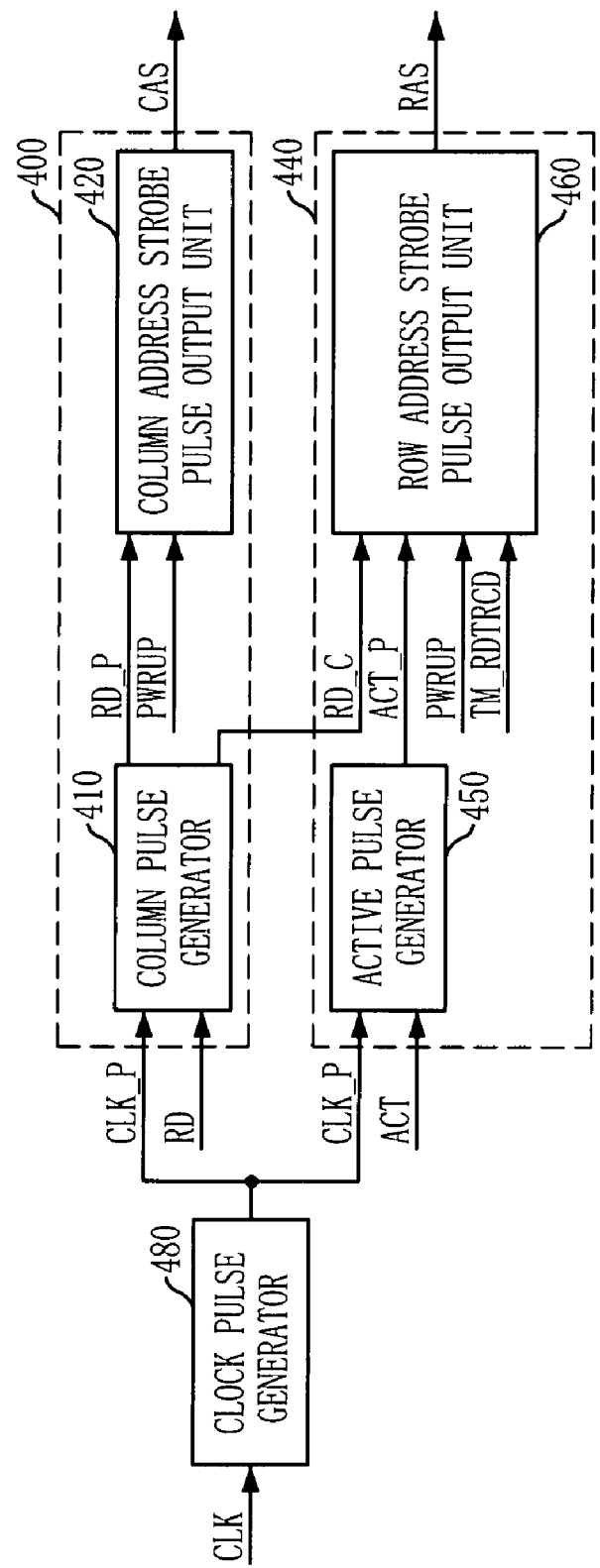
FIG. 4 is a block diagram illustrating an address strobe pulse generation circuit for use in a semiconductor memory device in accordance with a preferred embodiment of the present invention.

FIG. 4 is a block diagram illustrating an address strobe pulse generation circuit for use in a semiconductor memory device in accordance with an exemplary embodiment of the present invention.

Referring to FIG. 4, the inventive address strobe pulse generation circuit includes a column address strobe (CAS) pulse generator 400 for generating a CAS pulse CAS in response to a column command signal RD, and a row address strobe (RAS) pulse generator 440 for receiving an active command signal ACT or a column pulse RD_C to generate an RAS pulse RAS in response to a test mode signal TM_RDTRCD. In addition, it further includes a clock pulse generator 480 for generating a clock pulse CLK_P having the same frequency as a clock signal CLK and a preset activation interval in response to the clock signal CLK.

More specifically, the CAS pulse generator 400 is provided with a column pulse generator 410 for generating first and second column pulses RD_C and RD_P in response to the column command signal RD, the first column pulse RD_C being generated ahead of the second column pulse RD_P, and a CAS pulse output unit 420 for outputting the second column pulse RD_P as the CAS pulse CAS in response to a power-up signal PWRUP.

In the meantime, the RAS pulse generator 440 is provided with an active pulse generator 450 for generating an active pulse ACT_P in response to the active command signal ACT, and an RAS pulse output unit 460 for providing the active pulse ACT_P or the first column pulse RD_C as the RAS pulse RAS in response to the test mode signal TM_RDTRCD and the power-up signal PWRUP.

Figure 5:
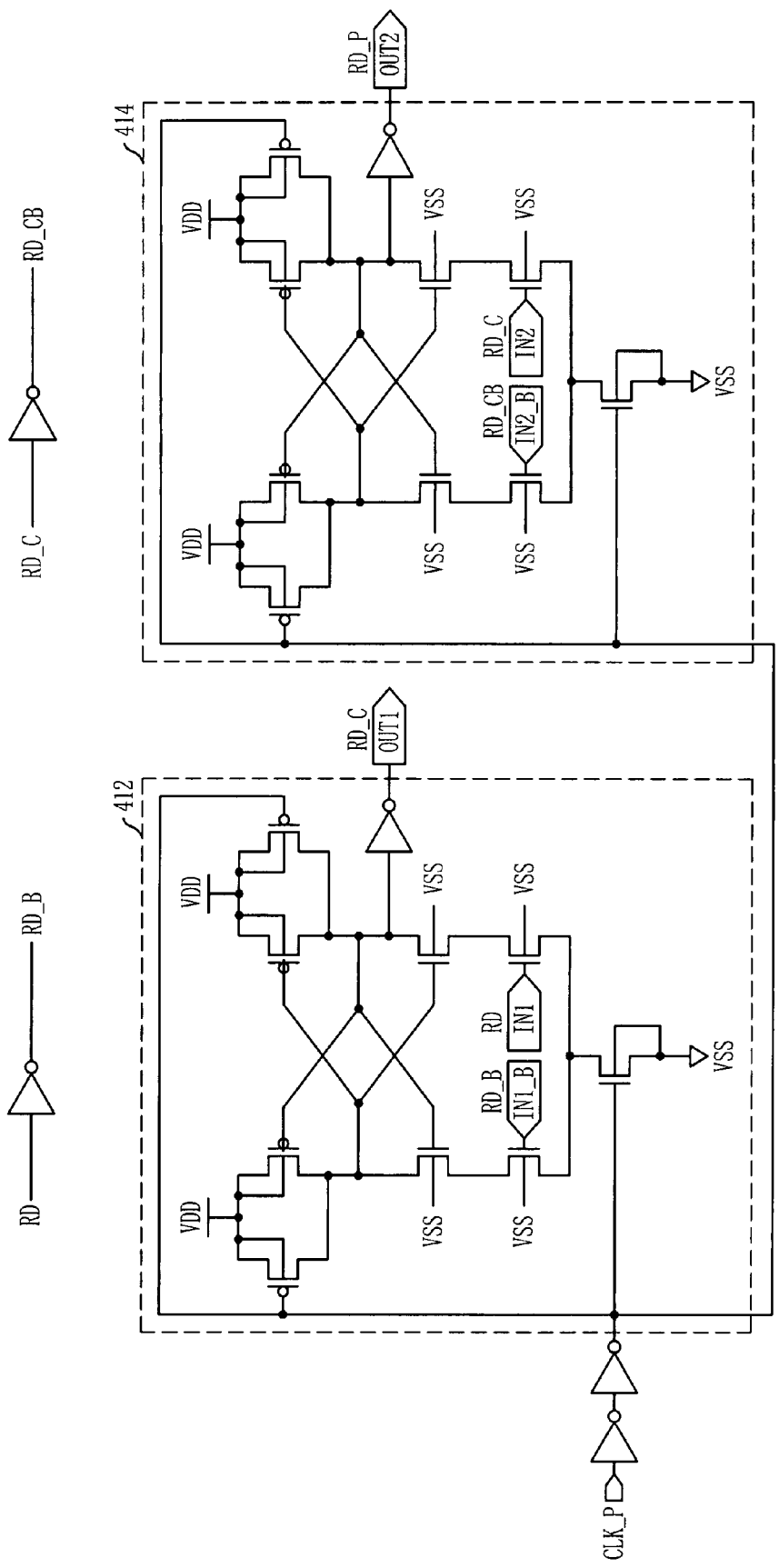
FIG. 5 is a detailed circuit diagram illustrating a column pulse generator of the address strobe pulse generation circuit shown in FIG. 4.

FIG. 5 is a detailed circuit diagram illustrating the column pulse generator of the inventive address strobe pulse generation circuit shown in FIG. 4.

Referring to FIG. 5, the column pulse generator 410 among the components of the inventive address strobe pulse generation circuit is composed of a first latch unit 412 for latching the column command signal RD and an inverted signal RD_B of the column command signal received through a first input end IN1 and a first inversion input end IN1_B in response to a clock pulse CLK_P to generate the first column pulse RD_C through a first output end OUT1; and a second latch unit 414 for taking the first column pulse RD_C from the first latch unit 412 and an inverted signal RD_CB of the first column pulse RD_C through a second input end IN2 and a second inversion input end IN2_B, and latching them in response to the clock pulse CLK_P to generate the second column pulse RD_P through a second output end OUT2.

Among the components of the RAS pulse generator 440, the active pulse generator 450 has a configuration similar to the column pulse generator 410 out of the components of the CAS pulse generator 400 although not shown in the drawing. That is, the active pulse generator 450 is designed in a manner that not the column command signal RD but the active command signal ACT is inputted and the active pulse ACT_P is outputted through the second output end OUT2 instead of outputting the second column pulse RD_P therethrough.

Figure 6:
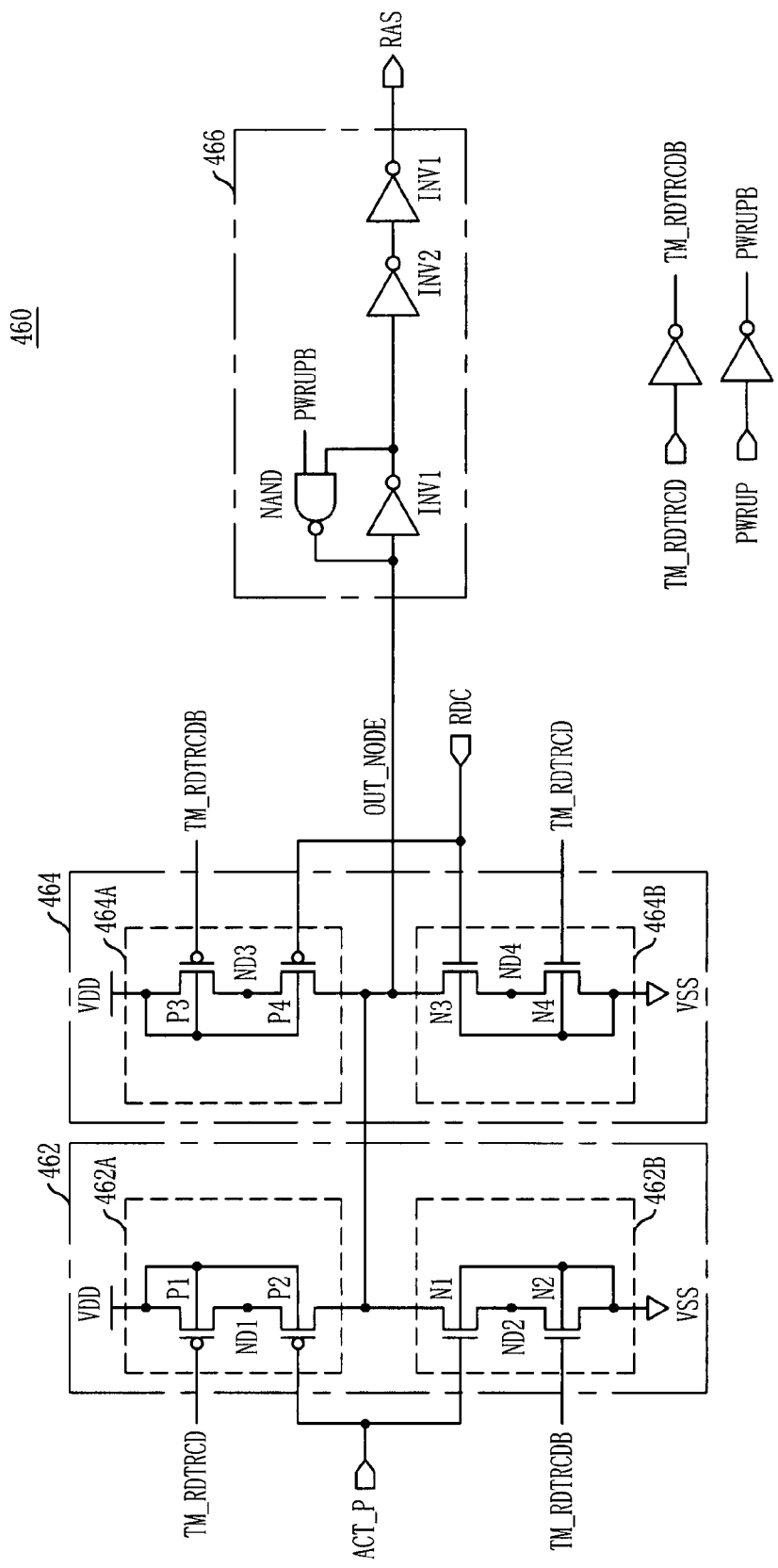
FIG. 6 is a detailed circuit diagram illustrating a RAS pulse output unit of the address strobe pulse generation circuit shown in FIG. 4.

FIG. 6 is a detailed circuit diagram illustrating the RAS pulse output unit of the inventive address strobe pulse generation circuit shown in FIG. 4.

Referring to FIG. 6, among the components of the inventive address strobe pulse generation circuit, the RAS pulse output unit 460 is provided with an active pulse output controller 462 for controlling the application of an active pulse ACT_P to an output node OUT_NODE in response to test mode signals TM_RDTRCD and TM_RDTRCDB, a column pulse output controller 464 for controlling the relay of a first column pulse RD_C to the output node OUT_NODE in response to the test mode signals TM_RDTRCD and TM_RDTRCDB, and a pulse output unit 466 for outputting a pulse applied to the output node OUT_NODE as the RAS pulse RAS in response to an inverted signal PWRUPB of the power-up signal.

To be more specific, the active pulse output controller 462 is provided with a pull-up driver 462A for pull-up driving the output node OUT_NODE in response to the test mode signal TM_RDTRCD and the active pulse ACT_P, and a pull-down driver 462B for pull-down driving the output node OUT_NODE in response to the inverted signal TM_RDTRCDB of the test mode signal and the active pulse ACT_P.

Among the components of the active pulse output controller 462, the pull-up driver 462A is composed of first and second PMOS transistors P1 and P2 arranged between a power supply voltage VDD end and the output node OUT_NODE. The first PMOS transistor P1 controls the connection of the power supply voltage VDD end and a delivery node ND1 coupled to its source-drain in response to the test mode signal TM_RDTRCD received via its gate. The second PMOS transistor P2 controls the connection of the delivery node ND1 and the output node OUT_NODE coupled to its source-drain in response to the active pulse ACT_P received via its gate.

Further, among the components of the active pulse output controller 462, the pull-down driver 462B is composed of first and second NMOS transistors N1 and N2 disposed between the output node OUT_NODE and a ground voltage VSS end. The first NMOS transistor N1 controls the connection of the output node OUT_NODE and a delivery node ND2 coupled to its source-drain in response to the active pulse ACT_P taken via its gate. The second NMOS transistor N2 controls the connection of the delivery node ND2 and the ground voltage VSS end coupled to its source-drain in response to the inverted signal TM_RDTRCDB of the test mode signal received via its gate.

The column pulse output controller 464 is provided with a pull-up driver 464A for pull-up driving the output node OUT_NODE in response to the inverted signal TM_RDTRCDB of the test mode signal and the first column pulse RD_C, and a pull-down driver 464B for pull-down driving the output node OUT_NODE in response to the test mode signal TM_RDTRCD and the first column pulse RD_C.

Among the components of the column pulse output controller 464, the pull-up driver 464A is composed of third and fourth PMOS transistors P3 and P4 between the power supply voltage VDD end and the output node OUT_NODE. The third PMOS transistor P3 controls the connection of the power supply voltage VDD end and a delivery node ND3 coupled to its source-drain in response to the inverted signal TM_RDTRCDB of the test mode signal received via its gate. The fourth PMOS transistor P4 controls the connection of the delivery node ND3 and the output node OUT_NODE coupled to its source-drain in response to the first column pulse RD_C received via its gate.

Further, among the components of the column pulse output controller 464, the pull-down driver 464B is composed of third and fourth NMOS transistors N3 and N4 between the output node OUT_NODE and the ground voltage VSS end. The third NMOS transistor N3 controls the connection of the output node OUT_NODE and a delivery node ND4 coupled to its drain-source in response to the first column pulse RD_C received via its gate. The fourth NMOS transistor N4 controls the connection of the delivery node ND4 and the ground voltage VSS end coupled to its drain-source in response to the test mode signal TM_RDTRCD received via it gate.

Next, the pulse output unit 466 is provided with a first inverter INV1 for inverting a pulse applied to the output node OUT_NODE, a NAND gate NAND for performing a NAND-operation on an output signal of the first inverter INV1 and the inverted signal PWRUPB of the power-up signal to provide a resulting signal to the output node OUT_NODE, a second inverter INV2 for inverting the output signal of the first inverter INV1, and a third inverter INV3 for inverting an output signal of the second inverter INV2 to output an inverted signal as the RAS pulse RAS.

Figure 1:
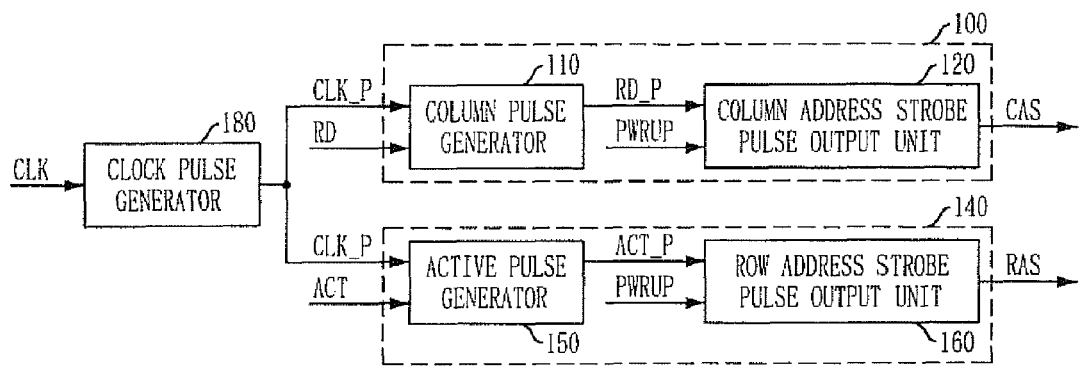
FIG. 1 is a block diagram showing a conventional address strobe pulse generation circuit for a semiconductor memory device.
Figure 2:
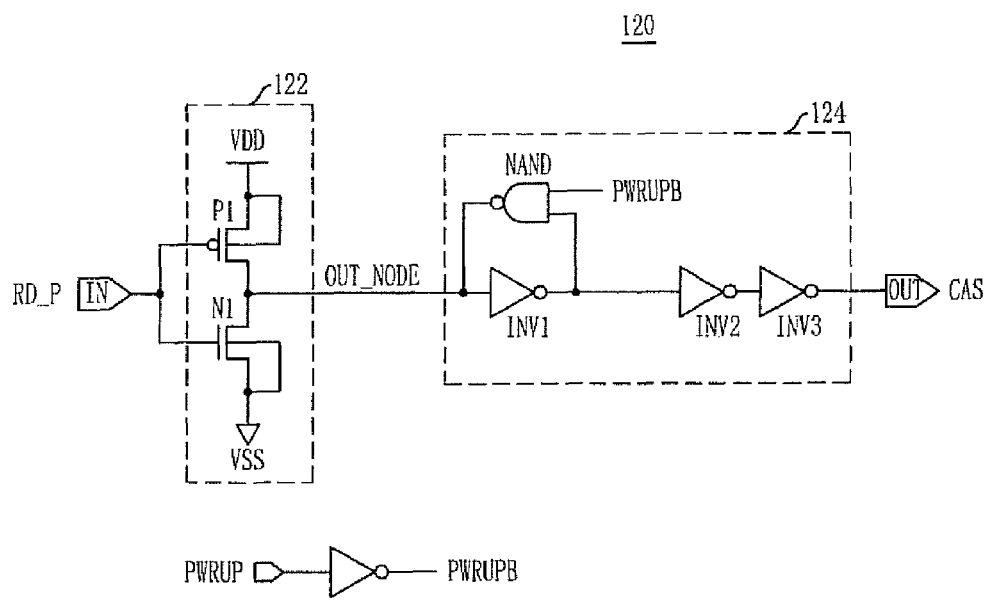
FIG. 2 is a detailed circuit diagram of the CAS pulse output unit of the conventional address strobe pulse generation circuit shown in FIG. 1.
Figure 3A:
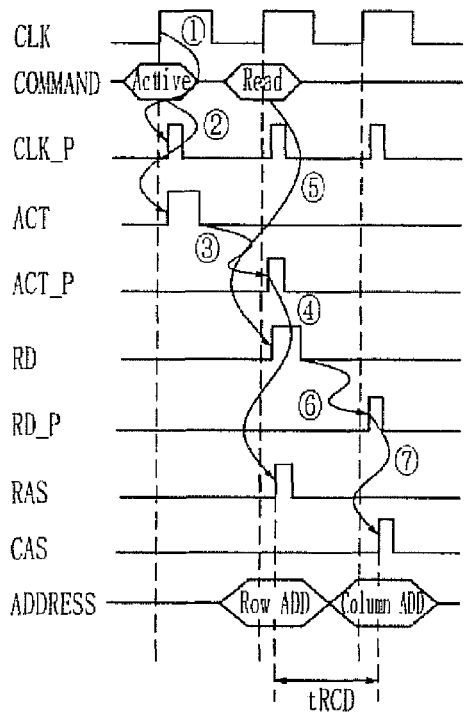
FIG. 3A is a signal timing diagram showing an operation of the conventional address strobe pulse generation circuit depicted in FIG. 1.
Figure 3B:
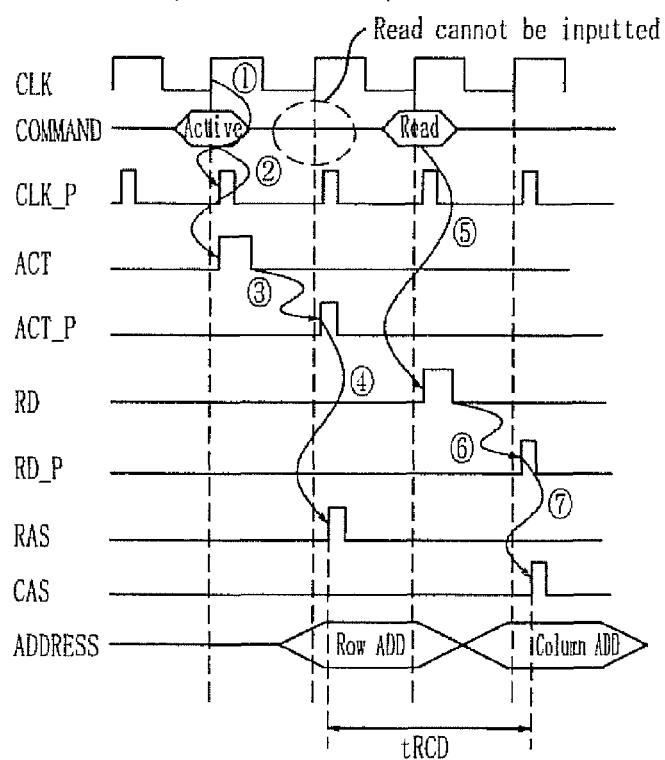
FIG. 3B is a signal timing diagram showing an operation of the conventional address strobe pulse generation circuit applied to the semiconductor memory device using the address double pump.

Lastly, among the components of the CAS pulse generator 400, the CAS pulse output unit 420 is the same as the configuration described in the corresponding part of the conventional address strobe pulse generation circuit shown in FIG. 1, and therefore, details thereof will be omitted here.

Now, the operation of the address strobe pulse generation circuit for the semiconductor memory device in accordance with the invention will be described in detail, based on the configuration thereof set forth above.

First, the clock pulse generator 480 is a component which prevents malfunctions of the semiconductor memory device due to a variation of activation interval of a clock signal CLK, which occurs by the effects of external environments because the clock signal CLK is applied thereto from the outside of memory device. That is, the clock pulse generator 480 outputs a clock pulse CLK_P activated in response to the activation of the clock signal CLK and deactivated after being activated for a given time period.

Among the components of the CAS pulse generator 400, the column pulse generator 410 generates first and second column pulses RD_C and RD_P having different activation time points in response to the column command signal RD. At this time, the first column pulse RD_C is generated ahead of the second column pulse RD_P.

Here, the first column pulse RD_C and the second column pulse RD_P are created by latching the column command signal RD and the inverted signal RD_B of the column command signal and the clock pulse CLK_P, and therefore, the first column pulse RD_C and the second column pulse RD_P and the clock pulse CLK_P have the same activation interval.

Among the components of the CAS pulse generator 400, the CAS pulse output unit 420 provides the second column pulse RD_P as the CAS pulse CAS in the activation interval of the power-up signal PWRUP. This is to prevent the generation of the CAS pulse CAS that is not preset before the power-up signal PWRUP is activated.

Meanwhile, among the components of the RAS pulse generator 440, the active pulse generator 450 creates the active pulse ACT_P in response to the active command signal ACT. At this time, the active pulse ACT_P is created by latching the active command signal ACT and the clock pulse CLK_P, and therefore, the active pulse ACT_P and the clock pulse CLK_P have the same activation interval.

Further, among the components of the RAS pulse generator 440, the RAS pulse output unit 460 outputs the first column pulse RD_C from the column pulse generator 410 or the active pulse ACT_P from the active pulse generator 450 as the RAS pulse RAS in response to the test mode signal TM_RDTRCD.

In other words, if the test mode signal TM_RDTRCD is activated to logic high, the RAS pulse output unit 460 outputs the first column pulse RD_P as the RAS pulse RAS, and if the test mode signal TM_RDTRCD is deactivated to logic low, it outputs the active pulse ACT_P as the RAS pulse RAS.

Figure 7:
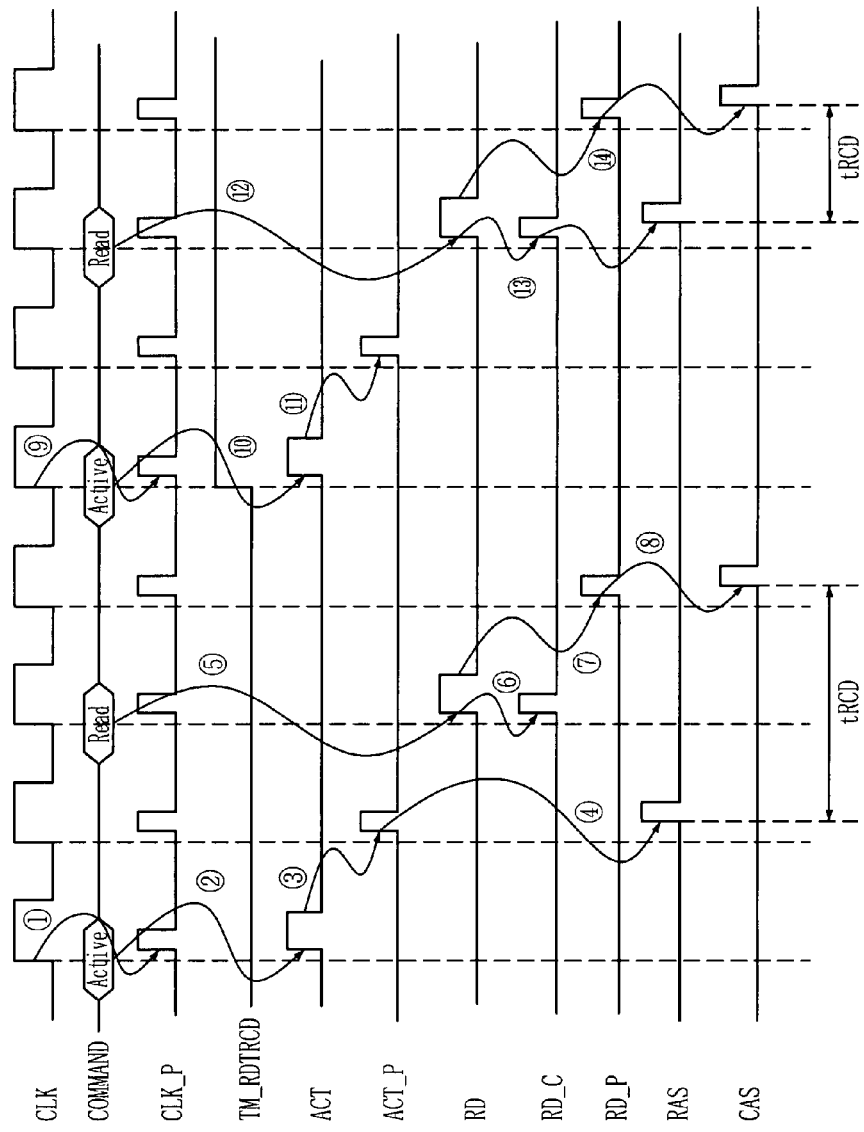
FIG. 7 is a signal timing diagram showing an operation of the address strobe pulse generation circuit for the semiconductor memory device in accordance with the present invention depicted in FIG. 4.

FIG. 7 is a signal timing diagram showing an operation of the address strobe pulse generation circuit for the semiconductor memory device in accordance with the present invention depicted in FIG. 4.

Referring to FIG. 7, it can be seen that the inventive address strobe pulse generation circuit for the semiconductor memory device is operated in different orders depending on the logic level of the test mode signal TM_RDTRCD.

First of all, regarding a case where the test mode signal TM_RDTRCD is deactivated to logic low, the clock pulse CLK_P is outputted in response to the clock signal CLK (①). Next, the active command signal ACT is inputted in response to the active command Active (②). The active command signal ACT and the clock pulse CLK_P are latched to output the active pulse ACT_P (③). Thereafter, the RAS pulse RAS is outputted in response to the active pulse ACT_P.

After inputting the active command signal ACT in response to the active command Active, the column command signal RD is inputted in response to a read command Read after a preset tRCD delay time, which corresponds to two periods of the clock signal CLK because the semiconductor memory device applies the address double pump in the drawing, regardless of the output process of the RAS pulse RAS (⑤).

The column command signal RD and the clock pulse CLK_P are latched to activate the first column pulse RD_C (⑥). After the first column pulse RD_C is activated, the column command signal RD and the clock pulse CLK_P are latched to activate the second column pulse RD_P after a given time period, which corresponds to one period of the clock signal CLK in the drawing (⑦).

Next, the CAS pulse CAS is outputted in response to the second column pulse RD_P because the test mode signal TM_RDTRCD was deactivated to logic low (⑧).

Thus, the RAS pulse RAS and the CAS pulse CAS are activated while keeping the time difference between the input of the active command signal ACT and that of the column command signal RD, which corresponds to two periods of the clock signal CLK in the drawing.

Considering a case where the test mode signal TM_RDTRCD is activated to logic high, the clock pulse CLK_P is first outputted in response to the clock signal CLK (⑨). Next, the active command signal ACT is inputted in response to the active command Active (⑩). The active command signal ACT and the clock pulse CLK_P are latched to output the active pulse ACT_P (⑪). However, the active pulse ACT_P is disregarded because the test mode signal TM_RDTRCD was activated to logic high.

After inputting the active command signal ACT in response to the active command Active, the column command signal RD is inputted in response to a read command Read after a preset tRCD delay time, which corresponds to two periods of the clock signal CLK since the semiconductor memory device applies the address double pump in the drawing, regardless of activation of the active pulse ACT_P (⑫).

The column command signal RD and the clock pulse CLK_P are latched to activate the first column pulse RD_C, and the RAS pulse RAS is outputted in response to the activated first column pulse RD_C (⑬).

After the first column pulse RD_C is activated, the column command signal RD and the clock pulse CLK_P are latched to activate the second column pulse RD_P after a given time period, which corresponds to one period of the clock signal CLK in the drawing, and the CAS pulse CAS is outputted in response to the activated second column pulse RD_P(⑭).

Thus, the RAS pulse RAS and the CAS pulse CAS are activated while keeping a shorter time than the time difference between the input of the active command signal ACT and that of the column command signal RD, which corresponds to one period of the clock signal CLK in the drawing.

That is, the RAS pulse RAS and the CAS pulse CAS are activated while keeping the given time period until the second column pulse RD_P is activated after the first column pulse RD_C is activated.

In case the semiconductor memory device employing the address double pump generates the RAS and CAS signals RAS and CAS by employing the exemplary embodiment of the present invention as mentioned above, it can adjust the time points of activation of the RAS signal RAS and of the CAS signal CAS by using the test mode signal TM_RDTRCD, thereby conducting the test within a shorter delay time than the minimum tRCD delay time of the semiconductor memory device by use of the address double pump.

Thus, since no design change is required to perform the test, it is possible to shorten the development time period of the semiconductor memory device employing the address double pump.

As a result, the present invention has an advantage in that it can perform a normal test by controlling a minimum tRCD value that is decided by an address double pump using a test mode signal, in test of a semiconductor memory device employing the address double pump.

Accordingly, since the present invention can test the semiconductor memory device employing such an address double pump without any design change, it is possible to shorten the time period required in developing the semiconductor memory device employing the address double pump.

It should be noted that the logic gates and transistors used in the above embodiment may be implemented at different locations and in different types based on the polarities of input signals.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
a column address strobe pulse generator configured to generate a column address strobe pulse in response to a column command signal; and
a row address strobe pulse generator configured to selectively use an active command signal and the column command signal in producing a row address strobe pulse in response to a test mode signal,
wherein the row address strobe pulse is produced in response to the active command signal in a normal mode and in response to the column command signal in a test mode.

2. The semiconductor memory device of claim 1, wherein the column address strobe pulse generator includes:
a column pulse generator for generating first and second column pulses in response to the column command signal, the first column pulse being generated ahead of the second column pulse; and
a column address strobe pulse output unit for outputting the second column pulse as the column address strobe pulse in response to a power-up signal.

3. The semiconductor memory device of claim 2, wherein the column pulse generator includes:
a first latch for latching the column command signal and a clock pulse to generate the first column pulse; and
a second latch for latching an output signal of the first latch and the clock pulse to provide the second column pulse.

4. The semiconductor memory device of claim 2, wherein the row address strobe pulse generator includes:
an active pulse generator for generating an active pulse in response to the active command signal; and
a row address strobe pulse output unit for outputting the active pulse or the first column pulse as the row address strobe pulse in response to the test mode signal and a power-up signal.

5. The semiconductor memory device of claim 4, wherein the row address strobe pulse output unit includes:
an active pulse output controller for controlling the application of the active pulse to an output node in response to the test mode signal;
a column pulse output controller for controlling the application of the first column pulse to the output node in response to the test mode signal; and
a pulse output unit for providing a pulse applied to the output node as the row address strobe pulse in response to an inverted signal of the power-up signal.

6. The semiconductor memory device of claim 5, wherein the active pulse output controller includes:
a pull-up driver for pull-up driving the output node in response to the test mode signal and the active pulse; and
a pull-down driver for pull-down driving the output node in response to an inverted signal of the test mode signal and the active pulse.

7. The semiconductor memory device of claim 5, wherein the column pulse output controller includes:

a pull-up driver for pull-up driving the output node in response to an inverted signal of the test mode signal and the first column pulse; and a pull-down driver for pull-down driving the output node in response to the test mode signal and the first column pulse.

8. The semiconductor memory device of claim 5, wherein the pulse output unit includes:

a first inverter for inverting the pulse applied to the output node;

an NAND gate for performing a NAND-operation on an output signal of the first inverter and the inverted signal of the power-up signal to provide a resulting signal to the output node;

a second inverter for inverting the output signal of the first inverter; and a third inverter for inverting an output signal of the second inverter to output an inverted signal as the row address strobe pulse.

9. The semiconductor memory device of claim 6, wherein the pull-up driver is provided with first and second PMOS transistors arranged between a power supply voltage end and the output node, the first PMOS transistor controlling the connection of the power supply voltage end and a delivery node coupled to its source-drain in response to the test mode signal received via gate thereof, and the second PMOS transistor controlling the connection of the delivery node and the output node coupled to its source-drain in response to the active pulse received via gate thereof.

10. The semiconductor memory device of claim 6, wherein the pull-down driver is provided with first and second NMOS transistors arranged between the output node and a ground voltage end, the first NMOS transistor controlling the connection of the output node and a delivery node coupled to its drain-source in response to the active pulse received via gate thereof, and the second NMOS transistor controlling the connection of the delivery node and the ground voltage end coupled to its drain-source in response to an inverted signal of the test mode signal received via gate thereof.

11. The semiconductor memory device of claim 7, wherein the pull-up driver is provided with first and second PMOS transistors between a power supply voltage end and the output node, the first PMOS transistor controlling the connection of the power supply voltage end and a delivery node coupled to its source-drain in response to an inverted signal of the test mode signal received via gate thereof, and the second PMOS transistor controlling the connection of the delivery node and the output node coupled to its source-drain in response to the first column pulse received via gate thereof.

12. The semiconductor memory device of claim 7, wherein the pull-down driver is provided with first and second NMOS transistors between the output node and a ground voltage end, the first NMOS transistor controlling the connection of the output node and a delivery node coupled to its drain-source in response to the first column pulse received via gate thereof, and the second NMOS transistor controlling the connection of the delivery node and the ground voltage end coupled to its drain-source in response to the test mode signal received via gate thereof.

13. A method for driving a semiconductor memory device, comprising:

generating a column address strobe pulse in response to a column command signal; and selectively using an active command signal or the column command signal in producing a row address strobe pulse in response to a test mode signal, wherein the row address strobe pulse is produced in response to the active command signal in a normal mode and in response to the column command signal in a test mode.

14. The method of claim 13, wherein generating the column address strobe pulse includes:

generating first and second column pulses in response to the column command signal, the first column pulse being generated ahead of the second column pulse; and outputting the second column pulse as the column address strobe pulse in response to a power-up signal.

15. The method of claim 14, wherein producing the row address strobe pulse includes:

generating an active pulse in response to the active command signal; and outputting the active pulse or the first column pulse as the row address strobe pulse in response to the test mode signal and the power-up signal.

16. The method of claim 15, wherein outputting the active pulse or the first column pulse as the row address strobe pulse includes:

controlling an application of the active pulse to an output node in response to the test mode signal;

controlling an application of the first column pulse to the output node in response to the test mode signal; and outputting a pulse applied to the output node as the row address strobe pulse in response to an inverted signal of the power-up signal.

* * * * *